United States Patent [19]

Mori et al.

[11] Patent Number: 4,943,733
[45] Date of Patent: Jul. 24, 1990

[54] PROJECTION OPTICAL APPARATUS CAPABLE OF MEASUREMENT AND COMPENSATION OF DISTORTION AFFECTING RETICLE/WAFER ALIGNMENT

[75] Inventors: Susumu Mori, Tama; Masato Shibuya, Kawasaki, both of Japan

[73] Assignee: Nikon Corporation, Tokyo, Japan

[21] Appl. No.: 436,745

[22] Filed: Nov. 15, 1989

Related U.S. Application Data

[63] Continuation of Ser. No. 192,766, May 10, 1988, abandoned.

[30] Foreign Application Priority Data

| May 15, 1987 | [JP] | Japan | 62-117167 |
| May 18, 1987 | [JP] | Japan | 62-119081 |
| May 18, 1987 | [JP] | Japan | 62-119082 |

[51] Int. Cl.⁵ ............................................ G01N 21/86
[52] U.S. Cl. ...................................... 250/548; 356/401
[58] Field of Search ............ 250/548, 557, 561, 237; 356/399, 400, 401

[56] References Cited

U.S. PATENT DOCUMENTS

| 4,200,395 | 4/1980 | Smith et al. | 356/400 |
| 4,423,959 | 1/1984 | Nakazawa et al. | 356/400 |
| 4,566,796 | 1/1986 | Leebrick | 356/401 |
| 4,631,416 | 12/1986 | Trutna, Jr. | 250/548 |
| 4,663,534 | 5/1987 | Ayata et al. | 250/557 |
| 4,668,089 | 5/1987 | Oshida et al. | 250/548 |
| 4,677,301 | 6/1987 | Tanimoto et al. | 250/548 |
| 4,723,845 | 2/1988 | Mizutani et al. | 250/561 |

*Primary Examiner*—David C. Nelms
*Attorney, Agent, or Firm*—Shapiro and Shapiro

[57] ABSTRACT

A projection optical apparatus has a projection optical system for projecting an image of a reticle pattern on a stage-mounted semi-conductor wafer and includes a light-emitting surface of the stage. A photoelectric detector receives light from the light-emitting surface through the projection optical system and the reticle. The stage is moved to move a projected image of the light-emitting surface relative to the reticle, and the positional relation between the projected image of the light-emitting surface and the reticle is determined. Numerical apertures of various components of the projection optical apparatus are set for optimal performance.

21 Claims, 11 Drawing Sheets

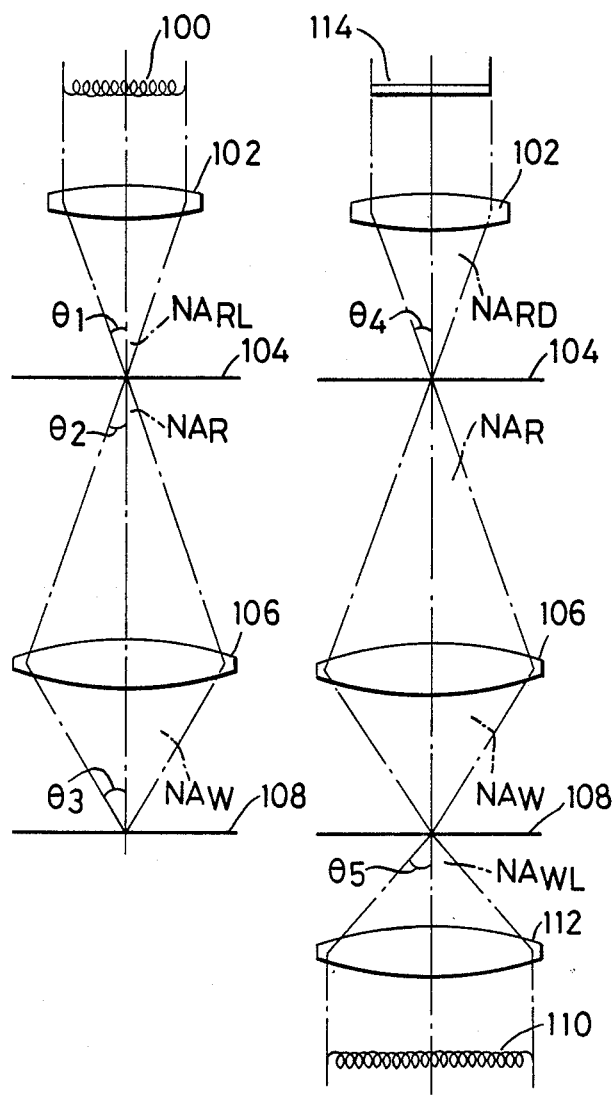

(σ = 0.5)

(σ = 0.7)

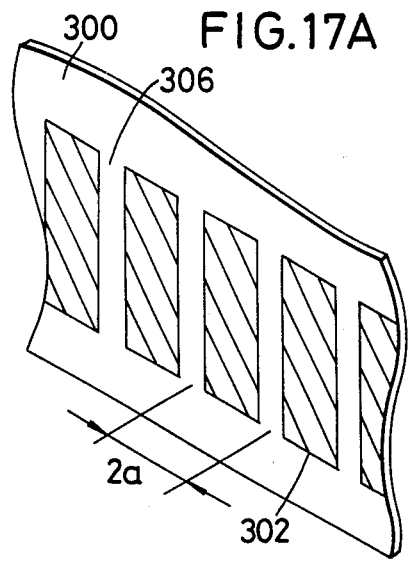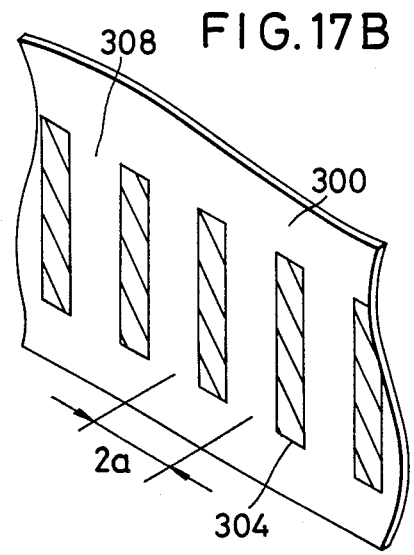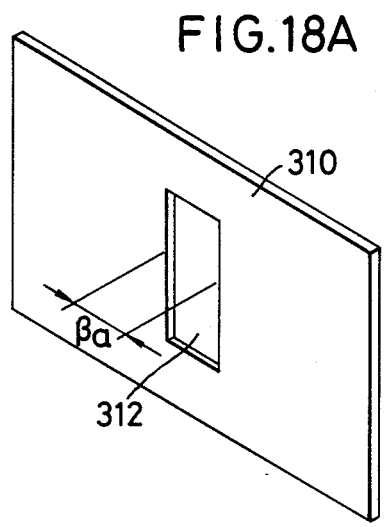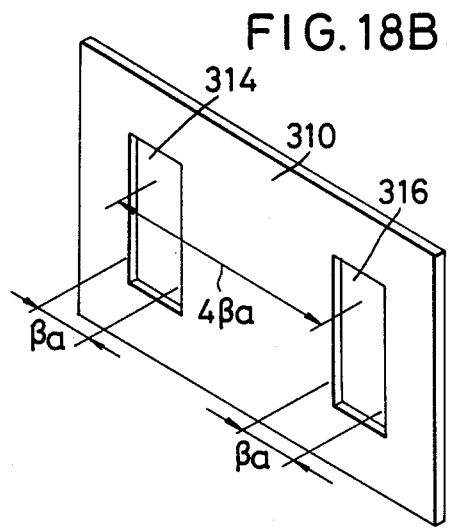

PROJECTION OPTICAL APPARATUS CAPABLE OF MEASUREMENT AND COMPENSATION OF DISTORTION AFFECTING RETICLE/WAFER ALIGNMENT

This is a continuation application of Ser. No. 192,766, filed May 10, 1988, now abandoned.

BACKGROUND OF THE INVENTION

1. Field of the Invention

This invention relates to a projection optical apparatus, and in particular to an apparatus for measuring the distortion or the magnification of a projection optical system.

2. Related Background Art

When measuring the distortion of an optical apparatus, particularly a projection optical system used in an exposure apparatus, a method using mark printing on a semiconductor wafer as shown, for example, in FIG. 1 of the accompanying drawings has heretofore been practised.

This method is one which utilizes an interferometer for measuring the coordinates position of a wafer stage to convert the amount of distortion of a projection optical system for exposure into a short dimension.

Referring to FIG. 1A, patterns P1 to P5 for distortion measurement are formed on a reticle R.

By the use of the reticle as described above, the patterns P1 to P5 are printed on a wafer W by whole surface exposure, as shown in FIG. 1B.

Subsequently, a blind is applied to the marks on the reticle R except for the central mark P3, and exposure is again effected on the wafer W as shown in FIG. 1C.

At this time, the coordinates value of the stage is set on the basis of the known design data, and as shown in FIG. 1D, the mark P3 is superposedly printed on the coordinates of the already printed marks PA to PE conforming to the respective design data thereof.

The marks superposedly formed in the manner described above will be congruent if it is assumed that there is no distortion in the projection optical system, but in fact, there is distortion in the projection optical system and therefore, deviation Δ occurs between the marks. The amount of distortion of the projection optical system can be measured on the basis of this deviation Δ.

However, the method as described above requires the process of repeating the exposure and development of the wafer twice and thereafter effect measurement. This leads to the inconvenience that measurement takes a long time.

Also, errors in the stoppage accuracy of the stage, the pattern measurement accuracy, etc. directly affect the distortion measurement accuracy, and this leads to the inconvenience that the reproducibility of measurement cannot be said to be good.

SUMMARY OF THE INVENTION

The present invention has been made in view of such points and has as an object the provision of a projection optical apparatus which can accomplish measurement of the distortion or the magnification of a projection optical system accurately within a short time.

The present invention is provided with a stage movable along a predetermined surface substantially coincident with the imaging plane of a projection optical system for effecting the projection of a pattern on a mask, stage position detecting means outputting a position signal corresponding to the position of the stage, light-emitting means provided on the stage and having a light-emitting surface of predetermined shape, photoelectric detector means for receiving the light from the light-emitting surface of the light-emitting means through the projection optical system and the mask, respectively, and position detecting means for controlling the stage so that the projected image of the light-emitting surface moves relative to a mark pattern formed at a predetermined position on the mask, and detecting the positional relation between the projected image of the light-emitting surface and the mask pattern on the basis of a photoelectric signal output from the photoelectric detector means and a position signal output from the stage position detecting means during said movement. More particularly, the numerical aperture of the light-receiving surface of said photoelectric detector means relative to the mask is set equal to the numerical aperture of the illuminating light during the pattern projection relative to the mask and the numerical aperture of the light-emitting means relative to the predetermined surface is set so as to be greater than the numerical aperture of the projection optical system relative to the predetermined surface.

According to the present invention, the numerical aperture of the light-receiving surface of the photoelectric detector means for receiving the light from the light-emitting means relative to the mask is first set equal to the numerical aperture of the illuminating light during the pattern projection relative to the mask.

In the above-described condition, movement of the stage, i.e., movement of the light-emitting means, is effected, and the positional relation between the projected image of the light-emitting means and the mask pattern is detected by the position detecting means.

The data obtained by these movements are compared with the design data and the imaging characteristic of the projection optical system is found.

This measured characteristic coincides with the characteristic of the projection optical system when the mask pattern is being projected.

BRIEF DESCRIPTION OF THE DRAWINGS

FIGS. 7A and 7B illustrate the arrangement and numerical apertures of essential portions of the first embodiment during exposure and measurement.

FIG. 8 illustrates the coordinates set by the essential portions during measurement.

FIGS. 17A and 17B are perspective views showing reticle patterns in the third embodiment.

FIGS. 18A and 18B are perspective views showing slits in the third embodiment.

DESCRIPTION OF THE PREFERRED EMBODIMENTS

Some embodiments of the present invention will hereinafter be described in detail with reference to the accompanying drawings.

Figure 2:
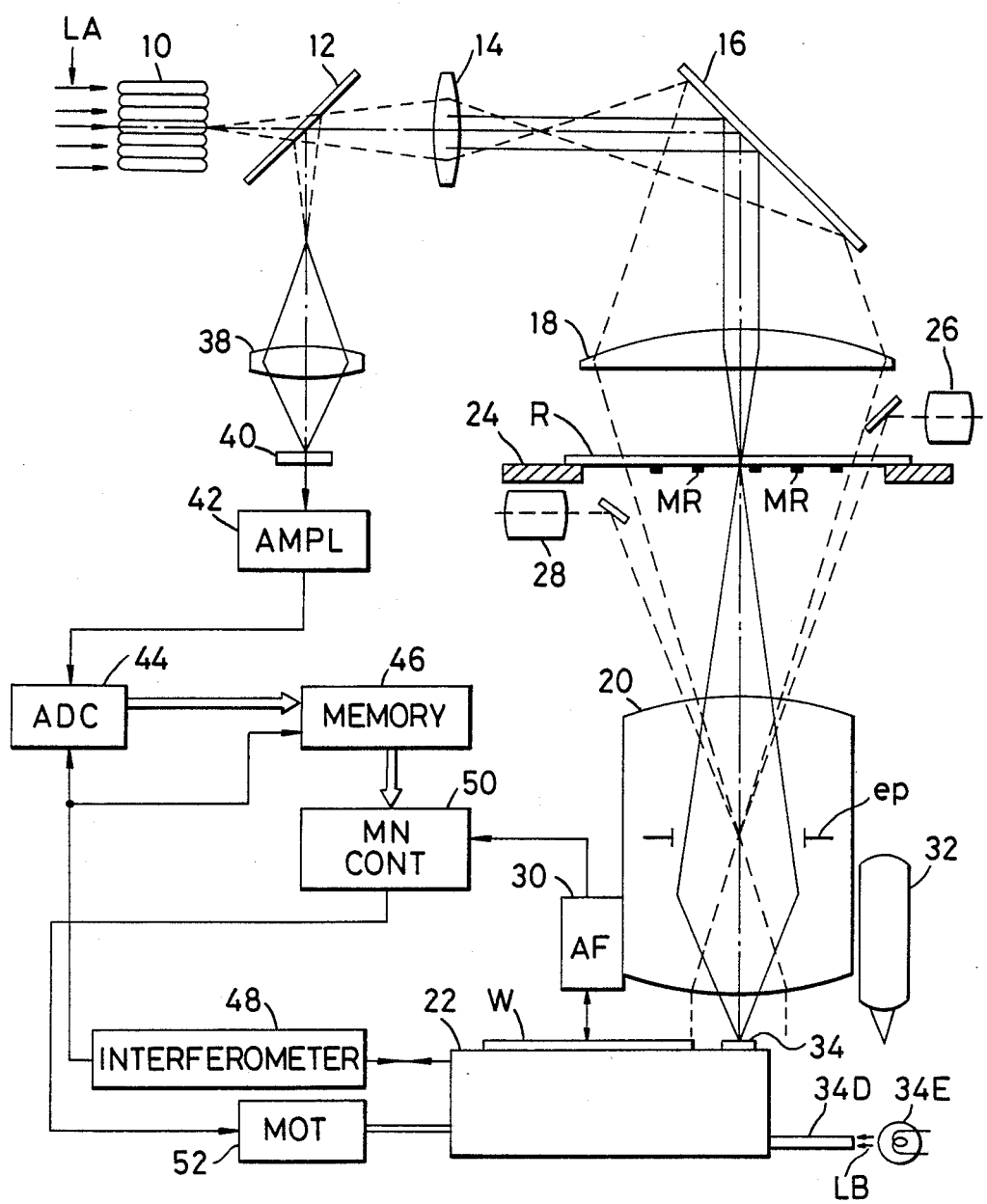
FIG. 2 shows the construction of an embodiment of the present invention.

In FIG. 2, there is shown the general construction of an embodiment of the present invention. In this figure, an illuminating light (for example, g-line and i-line) LA for exposure output from a suitable light source for exposure may pass through a fly-eye lens 10, a beam splitter 12 of low reflectance and a relay optical system 14 to a dichroic mirror 16.

The illuminating light LA reflected by the dichroic mirror 16 may be transmitted through a condenser lens 18 and may enter a reticle R, and may further be transmitted through a projection lens 20 whose image side has a telecentric characteristic and may illuminate a wafer W on a stage 22.

A TTL alignment microscope 26 for effecting alignment of the reticle R set on a reticle holder 24 and alignment of the reticle R and the wafer W and a TTL alignment microscope 28 exclusively for wafer alignment are disposed near the reticle R.

A focus sensor 30 for detecting the in-focus position of the wafer or a slit plate to be described and an off-axis microscope 32 for wafer alignment are disposed on the sides of the projection lens 20.

A slit plate 34 is provided on the aforementioned stage 22 so as to be the surface position of the wafer W.

Figure 3:
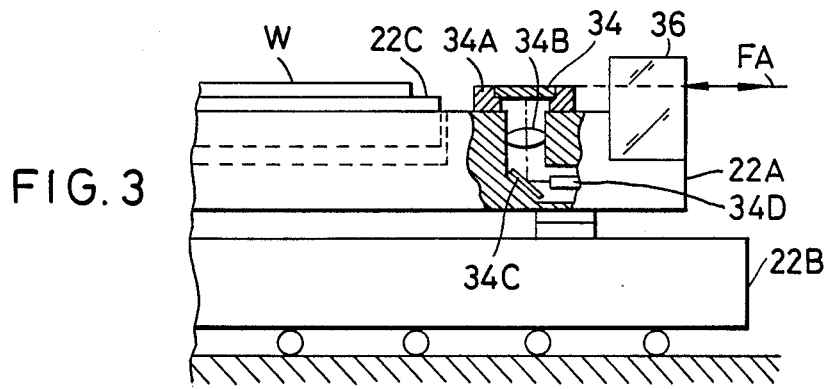
FIG. 3 partially shows an example of the detailed construction of a stage portion in the FIG. 2 embodiment.

In FIG. 3, there is enlargedly shown a crosssection of a portion of such a slit plate 34. In this figure, the stage 22 is comprised of a Z stage 22A movable in Z direction which is the vertical direction as viewed in the figure, an XY stage 22B movable in XY directions perpendicular to the Z direction, and a θ table 22C which is minutely rotatable. The wafer W is placed on the θ stage 22C, and the slit plate 34 is disposed and held on the Z stage 22A by a holder 34A.

A lens 34B, a mirror 34C and a an optical fiber 34D are disposed in the Z stage 22A, and the light LB of a light source 34E provided outside and outputting a light of the same wavelength as the exposure wavelength may illuminate the slit plate 34 from the inside of the stage.

Here, the characteristic and disposition of each optical element are set so that the numerical aperture of the light LB illuminating the slit plate 34 relative to the slit plate 34 is greater than the numerical aperture of the projection lens 20 relative to the wafer W.

A movable mirror 36 for a laser interferometer for measuring the coordinates position of the stage is provided sideways of the Z stage 22A so that as indicated by arrow FA, a laser beam may be applied substantially at the same level as the level of the slit plate 34.

Figure 4:
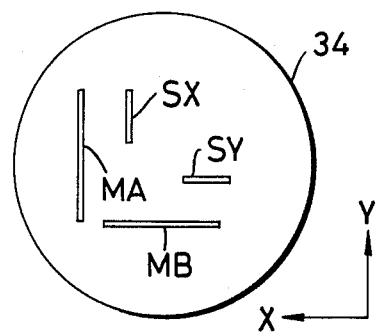
FIG. 4 is a plan view showing an example of a slit plate.

The slit plate 34 will now be described with reference to FIG. 4. The slit plate 34 is, for example, a light-transmitting glass plate formed with windows on slits by the use of chromium or the like, and in the example shown in FIG. 4, it is formed with light-emitting slits SX and SY for both X and Y directions, and reference marks MA and MB for respective alignment systems. The reference marks MA and MB do not form any feature of the present invention and therefore need not be described.

Figure 5:
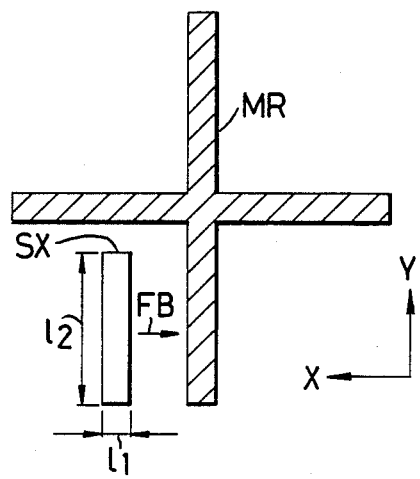
FIG. 5 illustrates the overlap between a reticle mark and a light-emitting slit.

The light-emitting slit SX is formed in a rectangular shape of width l1 and length l2, as shown in FIG. 5 which shows the projected state on the reticle R. Here, l1 and l2 are, for example, of the order of 4 μm and 100 μm, respectively.

On the other hand, a cruciform reticle mark MR is formed on the above-mentioned reticle R, as shown, for example, in FIG. 5. This reticle mark MR is formed of a material having a light-intercepting property, such as chromium or the like.

Next, as shown in FIG. 2, the light LB transmitted through the slit plate 34 on the stage 22 is transmitted through the projection lens 20, the reticle R and the condenser lens 18 and enters the dichroic mirror 16, and is reflected thereby. The reflected light passes through the relay optical system 14 and is reflected by the beam splitter 12, and is transmitted through a condensing lens 38 and enters a detector 40 for photoelectric conversion.

The condensing lens 38 may be omitted and the detector 40 may be directly disposed after the light has been reflected by the beam splitter 12.

As will be described later in detail, the detector 40 may preferably be disposed at a position optically substantially conjugate with the entrance pupil ep of the projection lens 20 and be designed so that the light-receiving surface thereof may have a size large enough to cover the whole of the pupil ep.

Also, the characteristic and disposition of each of said optical elements are set so that the numerical aperture formed by the light-receiving surface of the above-described detector 40 relative to the reticle R is equal to the numerical aperture formed by the illuminating light LA for exposure relative to the reticle R, as will be described later.

The photoelectric output of the detector may be amplified by an amplifier 42, be input to an analogdigital converter (hereinafter referred to as the "ADC") 44 and be converted into a digital signal thereby, and then be input as data to a memory 46.

The position signal of an interferometer 48 indicating the coordinates position of the stage 22 may be input to the ADC 44 and the memory 46, and AD conversion may be effected at the timing of such position signal and the output data of the ADC 44 may be stored synchronously in the address of the memory 46 represented by said signal.

Next, the outputting of the data stored in the memory 46 is effected to a main controller 50, which is designed to have the function of outputting a driving signal to a motor 52 for driving the stage 22, on the basis of the input data and the output of the focus sensor 30.

The operation of the above-described embodiment will now be roughly explained. First, in a state in which the illumination for exposure is not being effected, rectangular illumination is effected on the reticle R from the lower portion of FIG. 2 through the projection lens 20 because the light-emitting slit SX of the slit plate 34 is of a rectangular shape as described above.

As the stage 22 is moved, the image of the light-emitting slit SX projected onto the reticle R also moves. In the example shown in FIG. 5, the light-emitting slit SX moves in the direction of arrow FB relative to the reticle mark MR.

Figure 6:
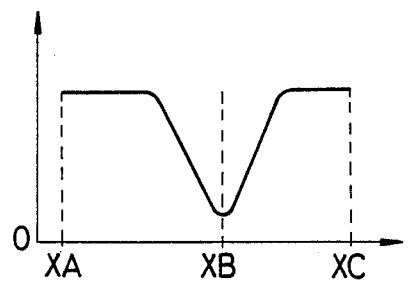
FIG. 6 is a graph showing an example of the wave form of the photoelectric signal of a detector.

By this movement, the image of the light-emitting slit SX comes to overlap the reticle mark MR. The degree of this overlap, as shown in FIG. 6, is sensed as a decrease in quantity of light in the detector 40. In the example shown in this figure, it is seen that in contrast with positions XA and XC, the quantity of light is most decreased at a position XB and the light-emitting slit SX well overlaps the reticle mark MR at this position.

Now, where there is no distortion in the projection lens 20, the position at which the light-emitting slits SX and SY overlap the reticle mark can be found from the design data, and this design position coincides with the light-quantity decrease position or the mark detecting point of the detector 40 stored in the memory 46.

Figure 1A:
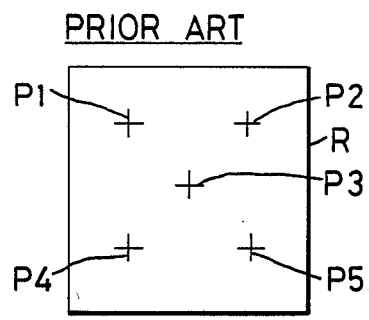
FIGS. 1A, 1B, 1C and 1D illustrate the prior art.
Figure 1B:
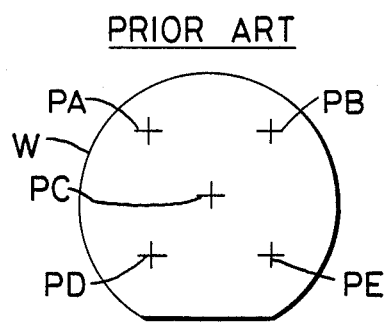
Figure 1C:
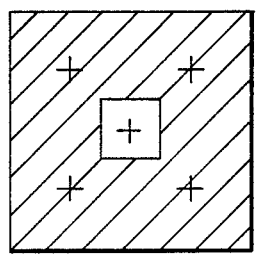
Figure 1D:
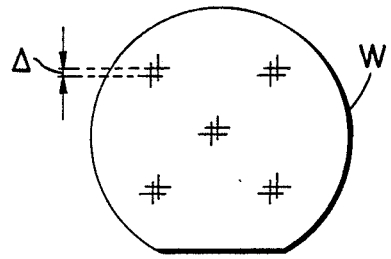

However, when there is distortion in the projection lens 20, they do not coincide with each other, and the design position does not coincide with the mark detecting point. Thus, the degree of such disparity corresponds to $\Delta$ in FIG. 1D.

Accordingly, the pattern of FIG. 5 is preformed on the reticle R over the area necessary to measure the distortion of the projection lens 20, whereby the distortion and magnification of the projection lens 20 are measured.

The stage movement for the sampling and storage of data as described above are effected on the basis of the control by the main controller 50.

Now, in the present embodiment, the pattern projection is effected in the direction opposite to that during exposure to thereby measure the distortion of the projection lens 20.

Accordingly, the numerical aperture of each lens of the apparatus is set so that the distortion of the projection lens 20 occurring during exposure coincides with the distortion of the projection lens 20 occurring during measurement.

The foregoing relation of the numerical apertures will now be described in detail. In FIG. 7A, there are shown the arrangement and numerical apertures of essential portions during exposure. In this figure, it is to be understood that an exposure light output from an exposure light source 100 is transmitted through a condenser lens 102 and a reticle surface 104 corresponding to the pattern surface of the reticle R, and further through a projection lens 106 and enters a wafer surface 108 corresponding to the surface of the wafer W.

Here, the numerical aperture of the exposure light relative to the reticle surface 104 is $NA_{RL}$ (which corresponds to $\sin\theta_1$), the numerical aperture of the projection lens 106 relative to the reticle surface 104 is $NA_R$ (which corresponds to $\sin\theta_2$), and the numerical aperture of the projection lens 106 relative to the wafer surface 108 is $NA_W$ (which corresponds to $\sin\theta_3$).

In FIG. 7B, there are shown the arrangement and numerical apertures of the essential portions during measurement. In this figure, it is to be understood that the measuring light output from a measuring light source 110 is transmitted through a condenser lens 112 and a predetermined surface 108 corresponding to the exposed surface of the wafer W and enters the projection lens 106 corresponding to the projection lens 20 and further, the measuring light transmitted therethrough is transmitted through the surface 104 of the reticle R and the condenser lens 102 and enters a detector 114 corresponding to the detector 40.

Here, the numerical aperture of the measuring light relative to the predetermined surface 108 is $NA_{WL}$ (which corresponds to $\sin\theta_5$), and the numerical aperture of the detector 114 relative to the reticle 104 is $NA_{RD}$ (which corresponds to $\sin\theta_4$) It is as described above that the slit plate 34 is positioned on the predetermined surface 108 and the pattern thereof is projected onto the reticle R.

Also, the coordinates system set in the various parts of the measuring system as described above is shown in FIG. 8. In this example, to make the understanding easy, the coordinates system is shown as a one-dimensional coordinates system.

As described above, in the present embodiment, the variation in the quantity of light of the detector 114 is found correspondingly to the moved position of the slit plate 34 on the stage 22, i.e., on the predetermined surface 108.

Thus, the quantity of light detected by such detector 114 is found as a function of the amount of movement of the slit plate 34.

First, as shown in FIG. 8, the coordinates in the measuring light source 110 is y and the intensity distribution of the measuring light source 110 is A(y). Also, the Fourier component of the amplitude transmittance of the pattern on the predetermined surface 108 (which corresponds to SX and SY of the slit plate 34) is defined as $$\exp(i\eta t)\cdot \widetilde{W}(\eta),$$

where $\eta$ is the Fourier coordinates of said pattern, t is the amount of movement of the pattern of the predetermined surface 108 (which corresponds to the position at the coordinates u), and $\widetilde{W}(\eta)$ is the Fourier component when $t=0$.

The light from the position of the coordinates y of the measuring light source 110 is diffracted in x direction by the pattern of the predetermined surface 108 and enters the projection lens 106. x is the coordinates indicating the direction and is indicated by a solid line along the optical path of FIG. 8, and has a magnitude proportional to $\sin\theta$ when the angle between it and the optic axis is $\theta$.

When the light enters the projection lens 106, $$x = y + \eta \tag{1}$$

Next, as regards the measuring light having emerged from the projection lens 106, if the magnification of the projection lens 106 is $\beta$ ($=NA_W/NA_R>0$), the direction of the diffracted light thereof is $$x' = x/\beta. \tag{2}$$

This light is further diffracted by the Fourier component $\overline{R}(\xi)$ of the pattern on the reticle surface 104 and enters the position of the coordinates s on the detector 114.

Here, $$s = x' - \xi. \tag{3}$$

Also, the sensitivity of the detector 114 at the position s is defined as S(s), and the pupil function representative of the wavefront aberration of the projection lens 106 is defined as G(x).

The intensity distribution I(s, t) of the incident light on the detector 114 may be found as follows by the use of the aforementioned equations (1) to (3) and the fact that the intensity distribution A(y) of the measuring light source 110 is that of an incoherent light source:

$$
\begin{aligned}
I(s,t) &= \int A(y)dy \cdot |\int W(\eta) \cdot \exp(it\eta) \cdot \\
&\quad G(x) \cdot R(\xi)d\xi|^2 \\
&= \int A(y)dy \cdot |\int W(\beta s + \beta \xi - y) \cdot \\
&\quad \exp\{it(\beta s + \beta \xi - y)\} \cdot \\
&\quad G(\beta s + \beta \xi) \cdot R(\xi)d\xi|^2
\end{aligned}
$$

Accordingly, the whole quantity of light I(t) detected by the detector 114 is $$
\begin{aligned}
I(t) &= \int A(y)dy \cdot \int S(s)ds \cdot \\
&\quad |\int R(\xi) \cdot G(\beta s + \beta \xi) \cdot \\
&\quad \exp\{it(\beta s + \beta \xi - y)\} \cdot \\
&\quad W(\beta s + \beta \xi - y)d\xi|^2
\end{aligned} \tag{4}
$$

Further, if the amplitude transmittance at the coordinates u of the pattern on the predetermined surface 108 (which corresponds to the pattern of the slit plate 34) is defined as W(u), it is expressed as $$W(\beta s + \beta \xi_1 - y) = C \cdot \int \exp\{+i(\beta s + \beta \xi_1 - y)u\}W(u)du,$$

where C is a constant. Thus, equation (4) becomes:

$$
\begin{aligned}
I(t) &= C \cdot \int A(y)dy \cdot \int S(s)ds \cdot \\
&\quad \int d\xi_1 d\xi_2 \cdot R(\xi_1) \cdot R^*(\xi_2) \cdot \\
&\quad G(\beta s + \beta \xi_1) \cdot G^*(\beta s + \beta \xi_2) \cdot \\
&\quad \exp\{it\beta(\xi_1 - \xi_2)\} \cdot \\
&\quad \int du_1 du_2 \cdot \exp\{+i(\beta s + \beta \xi_1 - y) u_1\} \cdot \\
&\quad \exp\{-i(\beta s + \beta \xi_2 - y) u_2\} \cdot W(u_1) \cdot W^*(u_2),
\end{aligned}
$$

where * is representative of complex conjugateness.

Now, as described above, the numerical aperture of the light LB illuminating the slit plate 34 relative to the slit plate 34 is made greater than the numerical aperture of the projection lens 20 relative to the wafer surface.

When illumination is thus done with a sufficiently great numerical aperture, A(y)=1 can be established. Consequently, $$\int_{-\infty}^{+\infty} A(y)dy \cdot \exp\{-iy(u_1 - u_2)\} = C \cdot \delta(u_1 - u_2)$$

and thus, $$
\begin{aligned}
I(t) &= C \cdot \int S(s)ds \cdot \int d\xi_1 d\xi_2 \cdot R(\xi_1) \cdot R^*(\xi_2) \cdot G(\beta s + \beta \xi_1) \cdot \\
&\quad G^*(\beta s + \beta \xi_2) \cdot \int du \cdot \exp\{i\beta(t + u)(\xi_1 - \xi_2)\} \cdot |W(u)|^2,
\end{aligned}
$$

where $\delta(u)$ is a delta function.

Further, if t+u is replaced with t+u=u', $$
\begin{aligned}
I(t) &= C \cdot \int S(s)ds \cdot \int d\xi_1 d\xi_2 \cdot R(\xi_1) \cdot R(\xi_2) \cdot G(\beta s + \beta \xi_1) \cdot \\
&\quad G^*(\beta s + \beta \xi_2) \cdot \int du' \cdot \exp\{i\beta u'(\xi_1 - \xi_2)\} \cdot |W(u' - t)|^2.
\end{aligned} \tag{5}
$$

If a part of this equation (5) is replaced with the following:

$$
\begin{aligned}
Iw(u') &= \int S(s)ds \cdot \int d\xi_1 d\xi_2 \cdot R(\xi_1) \cdot R^*(\xi_2) \cdot G(\beta s + \beta \xi_1) \cdot \\
&\quad G^*(\beta s + \beta \xi_2) \cdot \exp\{i \beta u'(\xi_1 - \xi_2)\},
\end{aligned} \tag{6}
$$

Iw(u') corresponds to the intensity at a point u' on the predetermined surface 108 of the object on the reticle 104 irradiated with an equivalent light source S(s).

From equations (5)–(6), the following is obtained:

$$\overline{I}(t) = C \cdot \int du' \cdot Iw(u') \cdot |W(u' - t)|^2 \tag{7}$$

This equation (7) is the convolution of the pattern on the predetermined surface 108 when the pattern on the predetermined surface 108 has moved by t and the intensity distribution of the image on the reticle Now, $|W(u'-t)|^2$ is known and therefore, IW(u') can be found from the above-mentioned equation (7). This means that if the shape of the detector 114 is the same as the shape of the equivalent light source during exposure, that is, if the numerical aperture $NA_{RD}$ of the detector 114 shown in FIG. 7B relative to the reticle surface 104 is equal to the numerical aperture $NA_{RL}$ of the exposure light source 100 shown in FIG. 7B relative to the reticle surface 104, the imaging characteristic of the projection lens 106 during exposure is measured by the detector 114.

In the foregoing description, it has been assumed that the numerical aperture $NA_{WL}$ of the illumination for measurement (see FIG. 7B) is sufficiently great, and if it is greater than the numerical aperture $NA_W$ of the projection lens 106, the 0-order diffracted light of the measuring light passes through the projection lens 106 and therefore, a substantially satisfactory result is obtained.

This is owing to the fact that if the value of $NA_{WL}/NA_W = \sigma$ of so-called illumination is $\sigma \geq 1$, the imaging performance of the projection lens 106 during measurement becomes substantially equal to the imaging performance of the projection lens 106 during exposure.

Hereinafter it is to be understood that the ratio NA1/NA2 between the numerical aperture NA1 of an optical system for illuminating a certain surface and the numerical aperture NA2 of an optical system for imaging the illuminated certain surface on a different surface relative to the certain surface is the $\sigma$ value.

Further, where a self-light-emitting object is used as the pattern on the predetermined surface 108 corresponding to the slit plate 34, it corresponds to the fact that the above-mentioned numerical aperture $NA_{WL}$ is sufficiently great and therefore, the use of such an object is acceptable.

Although the detector 114 (which corresponds to the detector 40 in the embodiment of FIG. 2) is disposed optically substantially conjugately with the pupil of the projection lens 106, the detector 114 may alternatively be disposed optically conjugately with the reticle surface 104.

However, if there is any irregularity of the sensitivity of the detector 114, such irregularity will provide a measurement error where the detector 114 is disposed conjugately with the reticle surface 104 and therefore, it is preferable that the detector 114 be disposed conjugately with the pupil of the projection lens 106.

Also, in FIGS. 7A, 7B and 8, the measuring light source 110 is disposed so as to be substantially conjugate with the pupil of the projection lens 106, but alternatively, the measuring light source 110 may be conjugate with the predetermined surface 108 and the condenser lens 112 may be omitted.

However, if this is done, the irregularity of the intensity of the measuring light source 110 will provide the irregularity of optical the illumination intensity on the predetermined surface 108 and therefore, it is preferable that the measuring light source 110 be made substantially conjugate with the pupil of the projection lens 106. This is because Keiler illumination is small in the influence of the irregularity of the light source, as compared with the critical illumination, while it is identical in the other characteristics to the latter.

In the embodiment of FIG. 2, the end surface of fiber 34D is disposed so as to be substantially conjugate with the exit pupil (not shown) of the projection lens 20.

When the numerical aperture during exposure illumination has been changed, the numerical aperture of the detector can be changed. For example, in the embodiment of FIG. 2, the exit surface of the flyeye lens 10 is substantially conjugate with the pupil of the projection lens 20 and further, the pupil is also conjugate with the detector 40 and therefore, when a stop is placed on the exit surface of the fly-eye lens 10 and the size thereof has been changed to change the numerical aperture thereof, a stop can be placed on the detecting surface of the detector 40 and the size thereof can also be changed to make the numerical aperture of measurement coincident with the numerical aperture of exposure. In principle, the sizes of the two stops can be changed in a proportional relation, but depending on the aberrations of the condensing lens 38, it is necessary to effect correction, and the amount thereof can be given as the amount of offset during designing.

Standing on the above-noted points, the general operation of the above-described embodiment will now be explained.

First, in a state in which exposure is not effected, the slit plate 34 is illuminated from the inside of the stage by the detecting light LB for distortion measurement.

Thus, rectangular illumination is effected on the reticle R from the lower portion of FIG. 2 through the projection lens 20.

Next, when the stage 22 is moved by the driving command of the main controller 50 to the motor 52, the light-emitting slit image projected onto the reticle R also moves and overlaps the reticle mark MR.

The degree of this overlap, as shown in FIG. 6, is detected as a decrease in the quantity of incident light on the detector 40.

This detection output, as described above, is AD-converted and stored in the memory 46. By the utilization of such data and the data during designing, the distortion of the projection lens 20 is measured.

As described above, according to the present embodiment, distortion and magnification can be accurately measured within a short time.

Also, the measured data are stored in the interior of the apparatus and therefore, when the position of the alignment mark on the wafer differs from the position of the alignment mark on the reticle which is to be aligned with that mark, correction of the alignment error by distortion can be accomplished easily.

Also, in the present embodiment, the semiconductor laser may be provided in the stage (for example, the Z stage 22A). If this is done, the optical fiber 34D, etc. may be eliminated.

The position of the slit plate 34 need not always coincide with the position of the surface of the wafer W, but during measurement, that position can be on the imaging plane of the projection lens 20.

Further, the detector 40 can also receive the reflected light from the object (for example, the wafer or the like) lying on the imaging plane of the projection lens 20 and therefore can also measure the reflectance of said object.

Measurement of distortion and magnification is often effected with respect to both directions of planes X and Y, but alternatively may be effected only in a one-dimensional direction.

A second embodiment of the present invention will now be described. Here, the optical characteristics and arrangement of a lens 34B, a mirror 34C and an optical fiber 34D are set so that the $\sigma$ value on the slit plate 34 becomes the same as the $\sigma$ value on the reticle R when illuminated by the illuminating light for exposure. This is because, as will be described later in detail, when there are aberrations in the projection lens 20, if such $\sigma$ values differ from each other, the intensity distribution of the image projected onto the wafer will change, though delicately, and the amount of distortion will also change. The construction of the second embodiment is the same as that of FIG. 2.

The above-mentioned change in distortion by the $\sigma$ value will now be described in detail.

Figure 9A:
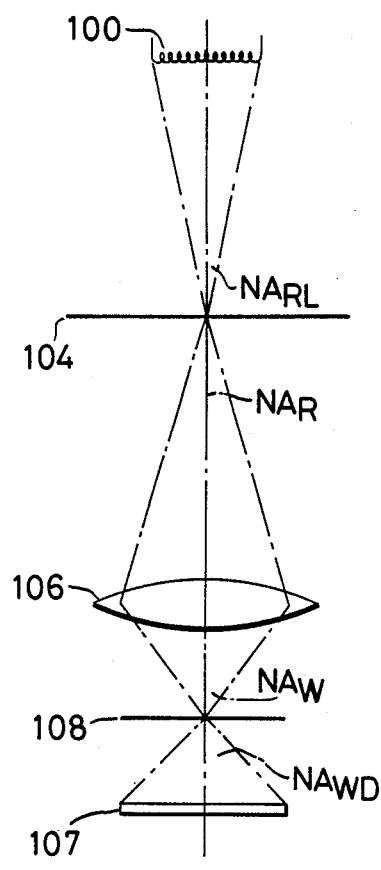
FIGS. 9A and 9B illustrate the arrangement and numerical apertures of the essential portions of a second embodiment during exposure and measurement.

FIG. 9A shows the arrangement and numerical apertures of the essential portions during exposure. In FIG. 9A, reference numerals similar to those in FIG. 7A are similar in significance to those in FIG. 7A and the lens 102 is omitted. The detector 107 is shown only for convenience of comparison with FIG. 9B which will be described later.

Here, the numerical aperture of the detector 107 side relative to the predetermined surface 108 is $NA_{WD}$.

The $\sigma$ value is generally represented by the ratio of the numerical aperture of the illuminating optical system to the numerical aperture of the projection optical system, and is expressed as $$\sigma = NA_{RL}/NA_R$$

relative to these numerical apertures.

A description will hereinafter be given of a variation in the projected image on the wafer surface caused by the difference in this $\sigma$ value.

Suppose cases where an isolated pattern having a width of 1 $\mu$m is projected onto the predetermined surface 108 and the $\sigma$ value is 0.5 and 0.7 when the numerical aperture of that side of the projection lens 106 which is adjacent to the wafer is $NA_W=0.35$ and the exposure wavelength is $\lambda=435.8$ nm.

Figure 10:
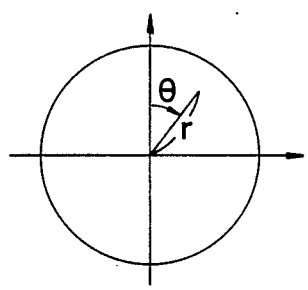
FIG. 10 illustrates a coordinates system set on the pupil of a projection lens.

Assuming that there is coma in the projection lens 106, the wavefront aberration W is expressed as $$W = a \cdot \gamma^3 \cdot \cos \theta,$$

where $a$ is a proportion constant and $\gamma$ and $\theta$ are the pupil coordinates set at the pupil position of the projection lens 104, as shown in FIG. 10. The intensity distribution of the projected image of said isolated pattern on the predetermined surface 108 when in the wavefront aberration W, $a=0$ and $a=\lambda/4$ is shown in FIG. 11.

In this figure, (A) shows a case where $\sigma=0.5$ and $a=0$, (B) shows a case where $\sigma=0.5$ and $a=/4$, (C) shows a case where $\sigma=0.7$ and $a=\lambda/4$.

Figure 11:
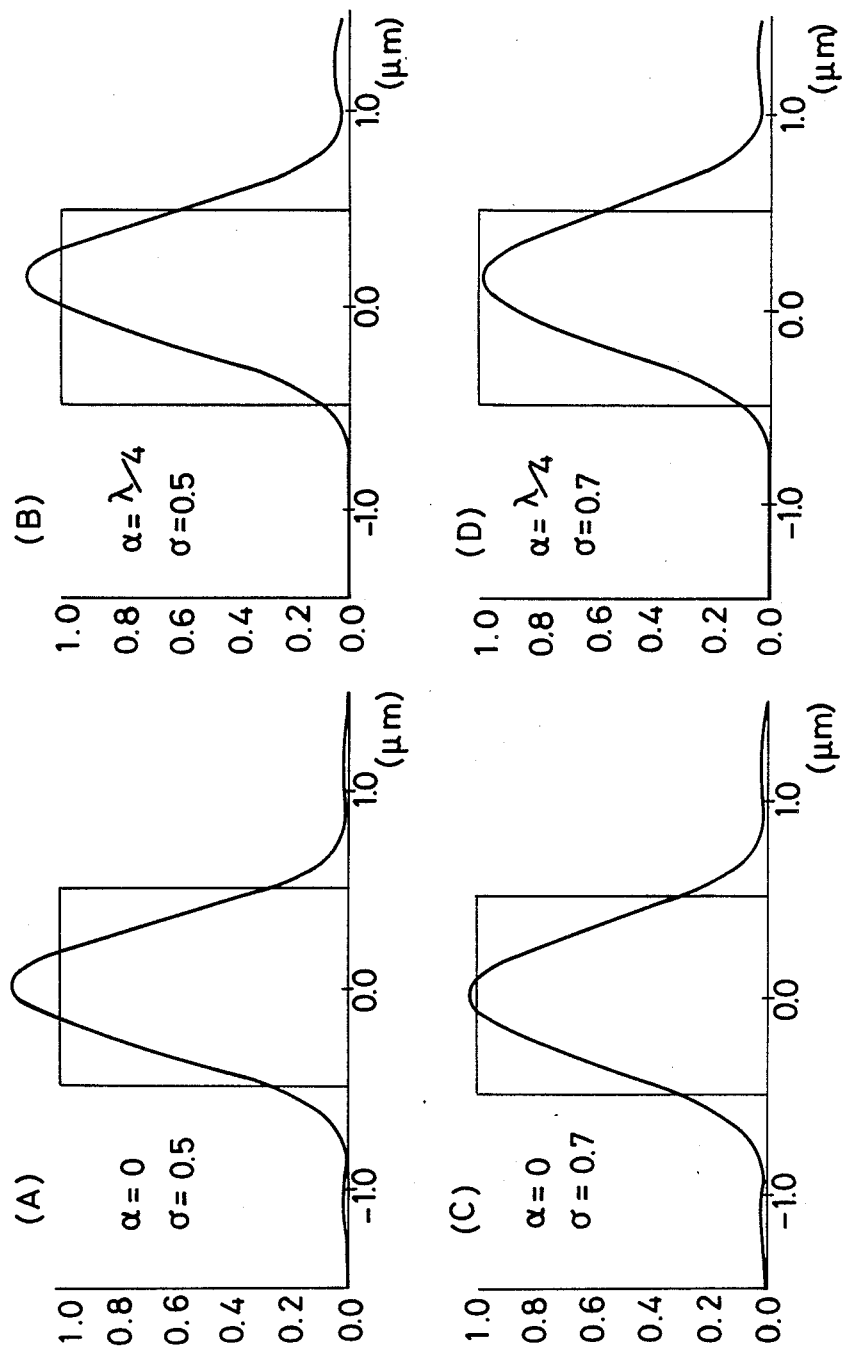
FIG. 11 is a graph showing an example of the intensity distribution of a rectangular pattern projected onto a wafer in the exposed condition.

That is, in FIG. 11, (A) and (C) show cases where the $\sigma$ value differs but there is no aberration in the projection lens 106, and (B) and (D) show cases where the $\sigma$ value differs but there are aberrations in the projection lens 106. Also, in FIGS. 11(A)–(D), the graph shown by a rectangle is the geometro-optically ideal image, and the ordinate represents the intensity normalized with the intensity of the geometro-optically ideal image as 1, and the abscissa represents the coordinates position on the predetermined surface 108.

As is apparent from FIGS. 11(A) and (C), when there is no aberration in the projection lens 106, the intensity distribution of the projected isolated pattern is bilaterally symmetrical and the central positions coincide with each other. That is, even if the value differs, the center of the projected pattern does not change.

In contrast, as is apparent from FIGS. 11(B) and (D), when there are aberrations in the projection lens 106, the intensity distribution of the projected isolated pattern changes and the center thereof becomes different because of the difference in the $\sigma$ value, as shown in the table below.

In the table below, the coordinates values of the central points of the intensity distribution of the projected pattern at the intensity levels of 80%, 60%, 40% and 20% of the intensity of the geometrooptically ideal image which is 1 are shown for respective $\sigma$ values.

TABLE

|  | $a = 0$ | $a = \lambda/4$ | |
|---|---|---|---|
|  | When $\delta = 0.5, 0.7$ | When $\delta = 0.5$ | When $\delta = 0.7$ |
| 80% | 0 | 0.163 | 0.177 |
| 60% | 0 | 0.160 | 0.175 |
| 40% | 0 | 0.155 | 0.173 |
| 20% | 0 | 0.148 | 0.171 |
| Average | 0 | 0.157 | 0.174 |

As is graphically shown in FIGS. 11(B) and (D), the shape does not so differ for $\sigma=0.5$ and $a=0.7$.

However, as shown in the table above, strictly observing, the position of the projected image changes by 0.01–0.02 μm. This amount is an amount that cannot be neglected in highly accurate distortion measurement.

Therefore, the second embodiment is designed such that the $\sigma$ value of the light-emitting slit plate 34 is similar to the $\sigma$ value when the reticle R is illuminated, whereby there occurs no change in the distortion of the projection optical system resulting from the difference in the $\sigma$ value.

Figure 9B:
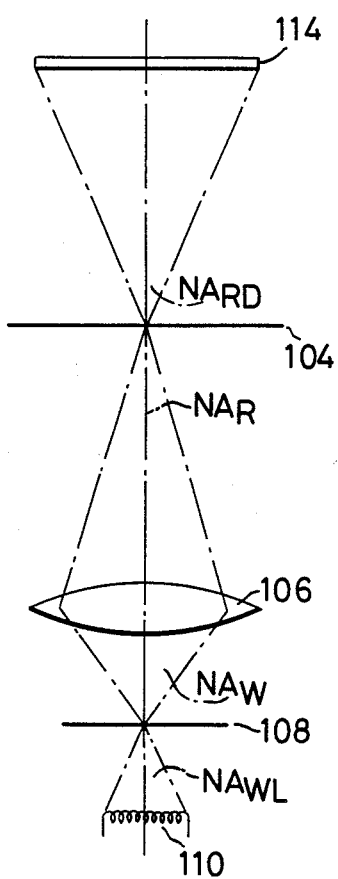

It is to be understood that as shown in FIG. 9B, the detecting light output from the light source 110 for distortion measurement is transmitted through the predetermined surface 108 and the projection lens 106 and enters the reticle surface 104 and is transmitted therethrough and enters the detector 114.

The $\sigma$ value of the above-mentioned light-emitting slit plate is the $\sigma$ value of the predetermined surface 108 side and therefore is expressed as $$\sigma = NA_{WL}/NA_W.$$

If this coincides with the $\sigma$ value of the reticle side or the exposure illumination side during exposure, the above-mentioned inconvenience will not occur and the distortion of the projection optical system can be measured well.

Thus, the distortion during exposure occurring in the reticle pattern projected onto the wafer W by the projection lens 20 coincides well with said measured distortion of the projection lens 20.

An embodiment that is improved over the second embodiment of the present invention will now be described with reference to FIG. 12. In this improved embodiment, portions similar to those of the above-described embodiment are given similar reference numerals.

As described above, it is necessary to make the $\sigma$ value of the illumination side during exposure coincide with the $\sigma$ value of the detection illumination side during measurement. Therefore, when exposure is to be effected with the $\sigma$ value of the illumination side which illuminates the reticle being changed, it is necessary to adjust the $\sigma$ value of the detection illumination side adjacent to the wafer correspondingly to that $\sigma$ value and effect distortion measurement.

Figure 12:
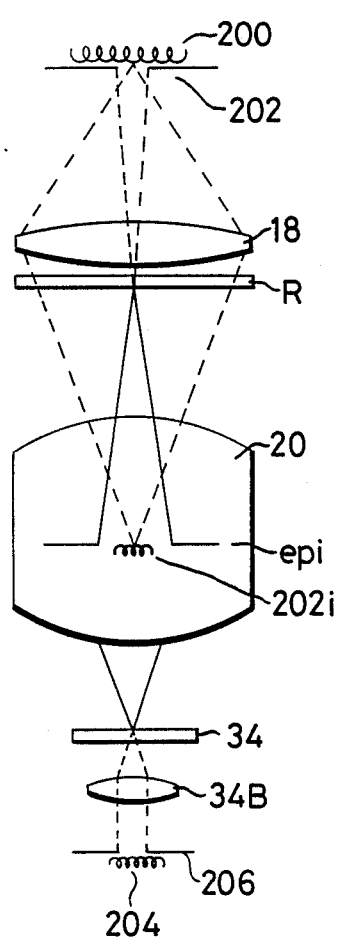
FIG. 12 shows the construction of essential portions of an embodiment improved with respect to the second embodiment.

In FIG. 12, there is schematically shown a an construction in which the $\sigma$ values of the exposure illumination side and the measurement illumination side are made variable.

Referring to this figure, a stop 202 is disposed on the light-emitting side of an exposure light source 200 for exposure illumination. The position of this stop corresponds to the exit surface or the like of the fly-eye lens 10. By changing the size of this stop 202, it is possible to change the $\sigma$ value of the exposure illumination side.

On the other hand, a stop 206 is correspondingly disposed on the light-emitting side of a measurement illumination light source 204 for distortion measurement. By changing the size of this stop 206, it is possible to change the $\sigma$ value of the measurement illumination side.

The measurement illumination light source 204 may be the end surface of the optical fiber 34D as in the example shown in FIG. 3, or a diffusing plate illuminated by a lamp or the like.

As described above, this embodiment, as compared with the embodiment of FIG. 2, is of a construction in which stops are respectively disposed on the light-emitting sides of light sources for exposure and for measurement.

Here the size of the stop 202 and the size of the stop 206 can in principle be changed in a proportional relation. Depending on the aberrations of the condenser lenses 18 and 34B, correction need be not made not in a perfect proportional relation, and its amount can be given as an amount of offset during designing.

The operation of the embodiment as described above will now be explained.

The exposure light emitted from the exposure light source 200 is subjected to the limitation of the area contributing to illumination by the stop 202, whereby the shape of the exposure light source 200 is substantially prescribed.

The exposure light thus subjected to the limitation of the illumination area uniformly illuminates the reticle R with the aid of the action of the condenser lens 18 and is condensed on the entrance pupil epi of the projection lens 20.

Figure 13:
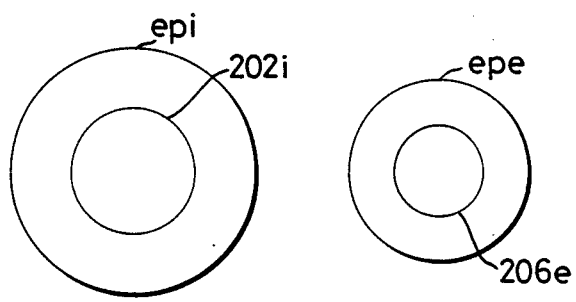
FIGS. 13 and 14 illustrate the operation of the improved embodiment of FIG. 12.

At this position, the image 202i of the stop 202 is formed as shown in FIG. 13A.

The size of the entrance pupil epi of the projection lens 20 corresponds to the numerical aperture $NA_R$ of the incidence side or the reticle side of the projection lens 20, and the size of the image 202i of the stop 202 corresponds to the numerical aperture $NA_{RL}$ of the illuminating optical system on the exposure side.

On the other hand, the detecting light for measurement emitted from the measurement illumination light source 204 is subjected to the limitation of the area contributing to illumination by the stop 206, whereby the shape of the measurement illumination light source 206 is substantially prescribed.

The detecting light thus subjected to the limitation of the illumination area uniformly illuminates the slit plate 34 with the aid of the action of the condenser lens 34B and is condensed on the exit pupil epe of the projection lens 20.

At this position, the image 206e of the stop 206 is formed as shown in FIG. 13B.

The size of the exit pupil epe of the projection lens 20 corresponds to the numerical aperture $NA_W$ of the exit side or the wafer side of the projection lens 20, and the size of the image 206e of the stop 206 corresponds to the numerical aperture $NA_{WL}$ of the illuminating optical system on the exposure side.

As is apparent from FIGS. 13A and 13B, the shape of the image 202i of the stop 202 relative to the entrance pupil epi is similar to the shape of the image 206e of the stop 206 relative to the exit pupil epe. That is, FIGS. 13A and 13B are in a similar relation with each other.

This corresponds to making the sigma value $\sigma_1$ (=$NA_{RL}/NA_R$) of the exposure illumination side coincide with the sigma value $\sigma_2$(=$NA_{WL}/NA_W$) of the measurement illumination side.

Figure 14:
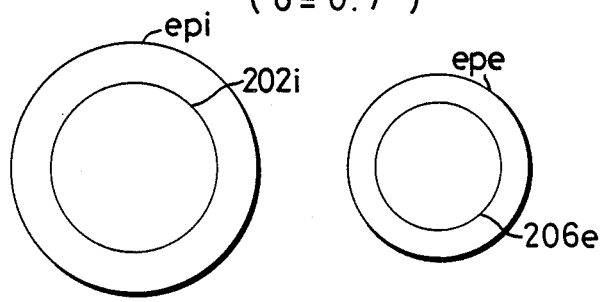

Accordingly, where the size of the stop 202 on the exposure illumination side is changed to make, for example, the light source image 202i on the entrance pupil epi of the projection lens 20 large as shown in FIG. 14A and the $\sigma$ value of the exposure illumination side is changed, the shape of the stop 206 on the measurement illumination side is also made large and the light source image 202e on the exit pupil epe of the projection lens 20 is made large as shown in FIG. 14B to thereby adjust the two $\sigma$ values so as to coincide with each other.

FIGS. 13B and 14B conceptionally represent the state of the exit pupil epe of the projection lens 20, and the exit pupil epe of the projection lens 20 is generally a telecentric system formed at infinity.

Also, even where the shape of the image of the exposure illumination light source is a special shape such as annular, the shape of the image of the measurement illumination light source can be made similar to the pupil of the projection lens.

A description will now be given of a third embodiment in which a stage provided with a detector as shown in U.S. Pat. Nos. 4,465,368 and 4,629,313 is used to detect the optical characteristic of the projection lens.

Figure 15:
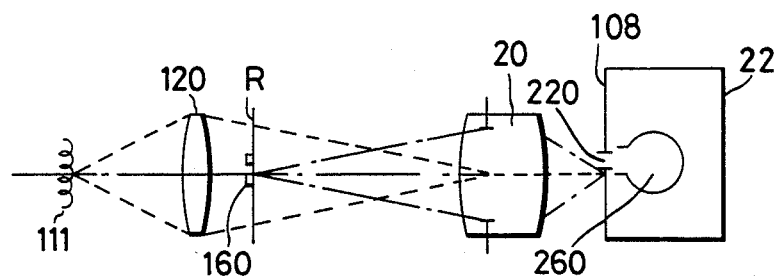
FIG. 15 shows a part of the construction of a third embodiment.

Referring to FIG. 15, the measurement light output from a measurement light source 111 and having the same wavelength as the exposure wavelength may be condensed by a condenser lens 120 and may enter a reticle R which is an object to be illuminated.

A pattern 160 for measurement is formed on the reticle R, and the image of this pattern 160 may be projected onto a detecting surface 108 by the action of a projection optical system 20.

A suitable slit 220 is formed in the detecting surface 108, and the measuring light transmitted through the slit 220 may enter a detector 260 such as a photomultiplier disposed in a stage 22 on which the detecting surface 108 is formed, whereby the whole quantity of light transmitted through the slit 220 may be converted into an electrical signal.

The construction of the third embodiment differs from the two previous embodiments in that a detector is provided on the stage, and is similar to the previous embodiments in the other points, i.e., the connections of the motor, interferometer, ADC, memory and main controller.

The operation of the above-described apparatus will now be described. The pattern 160 is illuminated by the measuring light output from the light source 111, and the image thereof is projected onto the detecting surface 108 by the action of the projection optical system 20. As in FIG. 2, when the motor 52 is driven on the basis of the command of the main controller 50, the stage 22 is moved. Thus, the slit 220 is moved relative to the projected image, and the projected image is scanned by the detector 260.

Figure 16:
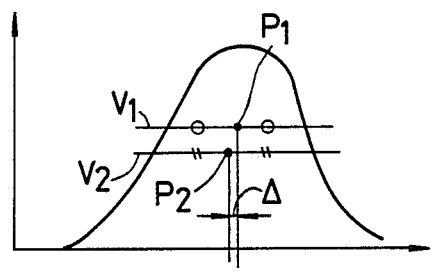
FIG. 16 is a graph showing a part of the principle of the third embodiment.

In FIG. 16, there is shown a variation in the quantity of input light of such detector 260 for the position of the stage. This is an example of the case where there are aberrations in the projection optical system 20 which is the object to be measured.

In this graph, if for example, the threshold value is set to a suitable level V1 so that the midpoint P1 thereof may be found, it is the central position of the projected image.

Next, the central position of the projected image when it is assumed that there is no aberration in the projection optical system 20 can be found in advance from the design data.

By comparing this center in designing with the center measured as shown in FIG. 16, the imaging characteristic of the projection optical system 20 can be obtained.

However, as shown in FIG. 16, the signal becomes bilaterally asymmetrical when there are aberrations in the projection optical system 20.

Thus, the value becomes different depending on how the threshold value is set when the central position of the projected image is to be found.

For example, when the threshold value is set to the level V2 of FIG. 16 and the center is found, the center is P2 and this means a deviation of Δ as compared with the above-described case. This deviation directly becomes a measurement error.

Also, the threshold value for finding the center of the projected image may electrically fluctuate within a predetermined range. Such fluctuation may also result in a measurement error, which in turn may lead to the inconvenience that the reproducibility of measurement is reduced.

The principle of the third embodiment will now be described. Referring to FIGS. 17A and 17B, light-intercepting portions 302 and 304 are formed on a reticle 300 for measurement by a material such as chromium and arranged at suitable intervals. The period thereof is 2a.

The pattern of the reticle is formed by the light-intercepting portions 302, 304 periodically arranged as described above and light-transmitting portions 306, 308 formed therebetween.

It should be noted that the widths of the light-intercepting portions 302 and 304 differ between what is shown in FIG. 17A and what is shown in FIG. 17B.

In FIGS. 18A and 18B, there are shown examples of the slit according to the third embodiment. First, in a detecting surface 310 shown in FIG. 18A, there is formed a slit 312 whose width is represented by $\beta a$ when the imaging magnification of the projection optical system 20 is $\beta(>0)$.

Also, in a detecting surface 310 shown in FIG. 18B, there are formed slits 314 and 316 whose width is also $\beta a$ and the distance between the centers of which is $4\beta a$.

The reticle 300 having the pattern as described above and the detecting surface 310 having the slit or slits as described above are applied instead of the reticle R and detecting surface 108 of the apparatus shown in FIG. 15.

The epitome of the operation of the embodiment constructed as described above will now be explained.

As noted above, the width of the slits 312–316 is $\beta a$. Accordingly, if the distribution of the intensity I of the projected image of the pattern on the detecting surface 310 in the direction of scan x is like a sine wave of period $2\beta a$ as shown in FIG. 19A, a photoelectric signal S obtained in the detector 260 when it is scanned by the slits 312–316 in the direction x of FIG. 19A is also like a sine wave of similar period as shown in FIG. 19B.

Figure 19:
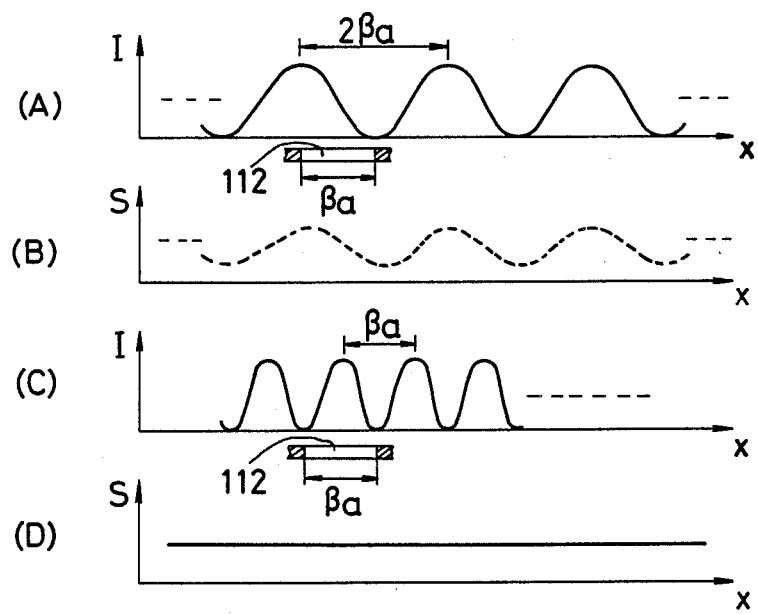
FIG. 19 is a graph showing the operation of the third embodiment.

Also, components whose periods are $\frac{1}{2}, \frac{1}{3}, \ldots, \frac{1}{m}$ of $2\beta a$ as shown in FIG. 19C are present in the Fourier component of the distribution of the intensity of said projected image and therefore, the energy after passing those slits is a component which hardly changes as shown in FIG. 19D even if the slits are moved, that is, a substantially direct current component. Therefore, the photoelectric signal of the detector 260 is one comprising the signals of FIGS. 19B and 19D combined together, i.e., a signal changing in the fashion of a sine wave.

If the detection photoelectric signal of the detector 260 thus becomes like an almost accurate sine wave, it assumes a bilaterally symmetrical wave form and therefore, however the threshold value is set, the central positions become coincident with each other and the accuracy and reproducibility of measurement are improved.

The operation of the above-described embodiment will now be described in detail by the use of mathematical expressions.

A description will first be given of a case where the slit 312 of FIG. 18A is used.

It is to be understood that the distribution of the intensity of the projected image on the aforementioned detecting surface 310 is represented by I(x) for the position coordinates X.

This I(x) may be resolved into the Fourier component as shown by the following equation (8):

$$I(x) = \sum_{k=-\infty}^{\infty} I(\eta_k) \exp[i\eta_k X] \qquad (8)$$

Here the period of the image is $2\beta a$ and hence, $$\eta_k = 2\pi K/2a\beta, \; \overline{I(\eta_k)} = \overline{I}(\overset{*}{-}\eta_k).$$

Also, * means complex conjugateness. Next, the slit 312 of width $\beta a$ is scanned and when the central position thereof is t, the whole quantity of light E(t) then detected is $$\begin{aligned} E(t) &= \int_{t - \beta a/2}^{t + \beta a/2} I(x)dx \\ &= \sum_{k=-\infty}^{+\infty} I(\eta_k) \cdot \exp[i\eta_k t] \cdot \\ & \quad (2/\eta_k) \cdot \sin\{\eta_k(\beta a/2)\} \\ &= \sum_{k=-\infty}^{+\infty} I(\eta_k) \cdot \exp[i\eta_k t] \cdot \\ & \quad (2a\beta/\pi k) \cdot \sin(\pi k/2) \\ &= \sum_{k=1}^{\infty} \{I(\eta_k) \cdot \exp[i\eta_k t] + I(-\eta_k) \cdot \\ & \quad \exp[-i\eta_k t]\} \cdot (2a\beta/\pi k) \cdot \\ & \quad \sin(\pi k/2) + I(0) \cdot a \cdot \beta, \end{aligned} \qquad (9)$$

but when $k=2m$ (m being a positive integer), $$\sin(\pi k/2) = 0$$

and further, it is assumed that there is no Fourier component whose period is $2\beta a/(2m+1)$ and therefore, the term of $k=2m+1$ (m being a positive integer) is not present.

Consequently, equation (9) becomes $$\begin{aligned} E(t) &= a\beta I(0) + \\ & \quad I(\pi/a\beta)\exp[i\pi t/a\beta](2a\beta/\pi) - \\ & \quad I(-\pi/a\beta)\exp[-i\pi t/a\beta](2a\beta/\pi) \\ &= A + B\cos\{(2\pi t/2a\beta) + C\} \end{aligned} \qquad (10)$$

and the signal becomes a sine wave signal. Here, A, B and C are suitable constants.

Therefore, whichever level of the graph of the signal intensity is used, the central position is determined to the same value, and the reproducibility of measurement is improved and becomes strong against noise.

Further, as shown in FIG. 18B, the pattern may be formed by a plurality of slits of width $\beta a$ arranged at a period $2l\beta a$ (l being a positive integer).

In such case, if the number of the slits is L, the intensity $E_L(t)$ of the signal is expressed as $$\begin{aligned} E_L(t) &= \sum_{k=1}^{L} \int_{t = (\beta a/2) + 2(k-1)\beta a}^{t + (\beta a/2) + 2(k-1)\beta a} I(x)dx \\ &= L \cdot E(t) \end{aligned}$$

and there can be obtained an effect similar to that when there is a single slit. In this case, the intensity of the signal is L times and therefore, measurement which is better in reproducibility and stronger against noise can be accomplished.

Next, the conditions under which the sine-wavelike signal as described above can be obtained may generally be found as follows.

When the Fourier component of the amplitude transmittance of the pattern of the reticle is $O(\nu)$ to the spatial frequency $\nu$ and the equivalent light source is $S_E(s)$ and the pupil function of the projection optical system 20 is $G(\nu)$ and the proportion constant is $\alpha$, the intensity $I(x)$ of the projected image at the position x by the projection optical system 20 is represented by the following equation:

$$I(X) = \alpha \cdot \int O(\nu) \cdot O^*(\nu') \cdot G(\nu + S) \cdot G^*(\nu' + S) \cdot S_E(s) \cdot \exp[i(\nu - \nu')X/\beta] d\nu d\nu' ds \quad (11)$$

Here, one-dimensional indication is adopted, but it is sufficient because the reticle pattern and slit are both periodical patterns in one direction as shown in FIGS. 17A and 17B and FIGS. 18A and 18B.

Now, the basic period of the reticle pattern is 2a and therefore, the spatial frequency $\nu$ assumes the following dispersive value $\nu_k$:

$$\nu_k = \frac{2\pi}{2a} k \text{ (k is an integer)} \quad (12)$$

By $\nu_{k1}$ and $\nu_{k2}$, the interference term indicative of the intensity distribution of fringes, with $\alpha'$ as the proportion constant, is:

$$\alpha \cdot \int ds O(\nu_{k1}) O^*(\nu_{k2}) \cdot G(\nu_{k1} + s) G^*(\nu_{k2} + s) S_E(s) \cdot$$
$$\exp[i(\nu_{k1} - \nu_{k2}) \cdot X/\beta] + \alpha \cdot \int ds O(\nu_{k2}) O^*(\nu_{k1}) \cdot$$
$$G(\nu_{k2} + s) G^*(\nu_{k1} + s) S_E(s) \cdot \exp[i(\nu_{k2} - \nu_{k1}) \cdot X/\beta] =$$
$$\alpha' \cdot \cos[(k_1 - k_2) \cdot X/2a\beta]$$

but if the term of $|k_1 - k_2| = 2m + 1$ (m being a positive integer) becomes zero, the signal will become a sine wave. However, a constant term is excepted from said interference term.

(A) The first case which satisfies such condition is that when the difference between the orders of two diffracted waves is "3", the both diffracted waves do not pass through the projection optical system 20 at the same time.

Figure 20A:
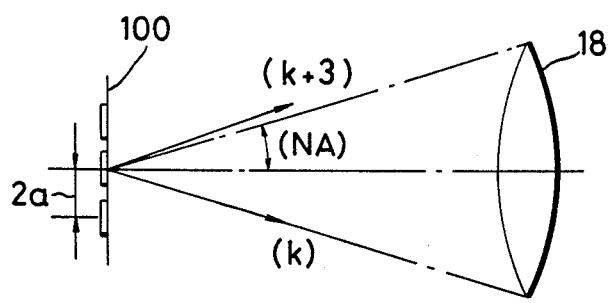
FIGS. 20A, 20B and 20C illustrate modes for obtaining the sine wave signal of the third embodiment.

In FIG. 20A, the above-noted condition is generally shown as the optical path diagram between the reticle pattern and the projection optical system.

The condition for which, in contrast with such kth-order diffracted light, the (k+3)th-order diffracted light does not enter the projection optical system 20 may be found as follows with the numerical aperture of that side of the projection optical system 20 which is adjacent to the reticle pattern as NA:

$$\frac{3\lambda}{2a} > 2NA \quad (13)$$

and $$a < \frac{3\lambda}{4NA}.$$

Figure 20B:
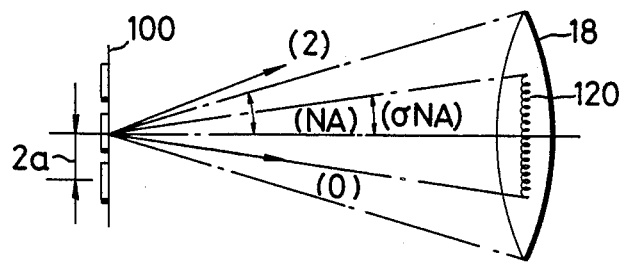

(B) Next, the second sufficient condition is that diffracted light of higher order than the 2nd-order light does not pass through the projection optical system 20. Such case is shown in FIG. 20B. From this figure, with the numerical aperture of the transmitted light source 320 at the position of the projection optical system 20 relative to the reticle pattern as $\sigma$ NA, the condition under which $\pm$2nd-order light is intercepted is $$\frac{2\lambda}{2a} - \sigma NA > NA \quad (14)$$

and $$a < \frac{\lambda}{(1 + \sigma)NA}.$$

Figure 20C:
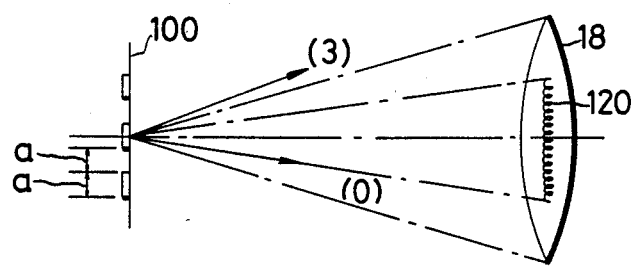

(C) Also, where the light-transmitting portion and the light-intercepting portion of the reticle pattern are of an equal width a as shown in FIG. 20C, there is present no $\pm$2nd-order diffracted light. Therefore, such a condition under which $\pm$3rd-order diffracted light is intercepted may be conceived. Accordingly, in such case, $$\frac{3\lambda}{2a} - \sigma NA > NA \quad (15)$$

and $$a < \frac{3\lambda}{2(1 + \sigma)NA}.$$

In any of the above-described cases, the positional change in the quantity of incident light on the detector 260 is like a sine wave and the central position can be determined well.

Specific examples of the numerical values will now be described. For example, when NA=0.35 and $\sigma$=0.5, and $\lambda$=0.4358 $\mu$m, the period of the reticle pattern may be a <0.93 $\mu$m, and when the widths of the light-transmitting portion and the light-intercepting portion are both a, a may be a<1.125 $\mu$m.

Next, when NA =0.35 and $\sigma$=0.2 and $\lambda$=0.4358 $\mu$m, a may be a<1.04 $\mu$m, and when the widths of the light-transmitting portion and the light-intercepting portion are both a, a may be a<1.56 $\mu$m.

An embodiment that is improved over the third embodiment will now be described.

(i) In the above-described embodiment, projection onto the slit side of the reticle pattern is effected by a predetermined light source, but by virtue of the reciprocity theorem, a similar effect can be obtained even if the light source is replaced with a detector. Accordingly, where this invention is applied to an exposure apparatus used for the manufacture of integrated circuits, it is of course also possible to simply make the direction of illumination opposite during exposure and during measurement of the imaging characteristic.

That is, the slit may be illuminated with a sufficiently great numerical aperture so that the $\sigma$ value by the numerical aperture formed by the detector relative to the reticle pattern may be the same as the $\sigma$ value by the numerical aperture of exposure illumination, and the light passed through the reticle pattern may be detected. At this time, the object illuminated is a slit of width $\beta$a, or slits in which the width $\beta$a is periodical (a period of 2n$\beta$a), and the pattern on the reticle is a pattern of period 2a.

(ii) Measurement is also possible by using the entire optical system reversely. That is, a slit of width a or slits in which the width is periodical at a period 2na are placed on the reticle illuminated during exposure, and a pattern of period 2$\beta$a is placed at a position whereat an image is formed during exposure ($\beta$ is the imaging magnification from the reticle to the image during exposure). Further, illumination is effected at the same $\sigma$ value as that during exposure from that side on which an image is formed during exposure, and the light passed through the pattern on the reticle is detected by a detector forming a sufficiently great angle of opening.

In this case, the numerical aperture NA' of the projection lens at the position whereat an image is formed during exposure is $$NA' = NA/\beta$$

and the period $2a'$ of the pattern is $2a' = 2\beta a$ and therefore, the $\sigma$ values are the same and thus, formulas (13), (14) and (15) are likewise established with respect to a' and NA'.

(iii) Also, a slit of width a or slits in which the width a is periodical at a period 2na are placed on the reticle illuminated during exposure, and a pattern of period $2\beta a$ is placed at a position whereat an image is formed during exposure. Then, the pattern on the reticle is illuminated with a sufficiently great numerical aperture, and the quantity of amount passed through the pattern lying at the position whereat an image is formed during exposure is detected by such a detector that the $\sigma$ value by the numerical aperture formed by the detector is equal to the $\sigma$ value on the reticle during exposure illumination.

Again in this case, as in the case (ii), if use is made of the numerical aperture of the projection lens $NA' = NA/\beta$ and the period of the pattern $2a = 2\beta a$, formulas (13), (14) and (15) are likewise established.

The shapes of the reticle pattern and slits are not limited to those shown in the above-described embodiments, but various shapes exist.

Particularly, in the reticle pattern, if that pattern is of three or more periods, it can be approximately regarded as a periodical object and the reproducibility of measurement becomes better.

Further, the detector may be not only a photomultiplier, but also a CCD image sensor or the like.

We claim:

1. A projection optical apparatus for illuminating a reticle, on which a desired pattern is formed by a light-transmitting member and a light-intercepting member, by illuminating light from an illuminating optical system, and forming the image of said pattern on a predetermined imaging plane through a projection optical system, including:

stage means movable along the imaging plane of said projection optical system;
   first position detecting means for outputting a position signal corresponding to the position of said stage means;
   light-emitting means provided on said stage means and having a light-emitting surface of predetermined shape for emitting light to said projecting optical system;
   photoelectric detector means for receiving light from the light-emitting surface of said light-emitting means through said projection optical system and said reticle, respectively; and
   second position detecting means for controlling said stage means so that a projected image of said light-emitting surface moves relative to said reticle, and detecting the positional relation between the projected image of said light-emitting surface and said reticle on the basis of the output from said photoelectric detector means and the output from said first position detecting means during said movement;
   the numerical aperture of the light-receiving surface of said photoelectric detector means relative to said reticle being set substantially equal to the numerical aperture of said illuminating light relative to said reticle, and the numerical aperture of said light-emitting means relative to said imaging plane being set greater than the numerical aperture of said projection optical system relative to said imaging plane.

2. A projection optical apparatus according to claim 1, wherein said light-emitting means has a light source disposed at the opposite side of said predetermined imaging plane relative to said projection optical system, and has a light-emitting member which substantially corresponds to said predetermined imaging plane, and wherein said light-emitting member has a light-transmitting area and a light-intercepting area which form said light-emitting surface.

3. A projection optical apparatus according to claim 2, wherein said light-emitting means has a light-emitting optical system disposed between said light source and said light-emitting member.

4. A projection optical apparatus according to claim 1, which has a detecting optical system for directing light from said reticle and causing said photoelectric detector means to be conjugate with the entrance pupil of said projection optical system respecting said illuminating optical system.

5. A projecting optical apparatus according to claim 1, wherein the wavelength of light from said light-emitting means is substantially equal to the wavelength of said illuminating light.

6. A projection optical apparatus for illuminating a reticle, on which a desired pattern is formed by a light-transmitting member and a light-intercepting member, by illuminating light from an illuminating optical system, and forming the image of said pattern on a predetermined imaging plane through a projection optical system, including:

(a) stage means movable along the imaging plane of said projecting optical system;
   (b) first position detecting means for outputting a position signal corresponding to the position of said stage means in a direction along the imaging plane of said projection optical system;
   (c) light-emitting means provided on said stage means and having a light-emitting surface of a predetermined shape for emitting light to said projection optical system;
   (d) photoelectric detector means for receiving light from said light-emitting means through said projection optical system and said reticle, respectively; and
   (e) second position detecting means for controlling said stage means so that a projected image of said predetermined pattern moves relative to said reticle, and detecting the positional relation between the projected image of said predetermined pattern and said reticle on the basis of the output from said photoelectric detector means and the output from said first position detecting means during said movement;
   (f) a ratio of the numerical aperture of said illuminating optical system to the numerical aperture of said projection optical system with respect to said illuminating light being set substantially equal to a ratio of the numerical aperture of said light-emitting means with respect to light from said light-emitting means to the numerical aperture of said projection optical system with respect to light from said light-emitting means.

7. A projection optical apparatus according to claim 6, wherein said light-emitting means has a light source disposed at the opposite side of said predetermined imaging plane relative to said projection optical system, and has a light-emitting member which substantially corresponds to said predetermined imaging plane, and wherein said light-emitting member has a light-transmitting area and a light-intercepting area which form said light-emitting surface.

8. A projection optical apparatus according to claim 7, wherein said light-emitting means has a light-emitting optical system disposed between said light source and said light-emitting member.

9. A projection optical apparatus according to claim 6, which has a detecting optical system for directing light from said reticle and causing said photoelectric detector means to be conjugate with the entrance pupil of said projection optical system respecting said illuminating optical system.

10. A projection optical apparatus according to claim 6, wherein the wavelength of light from said light-emitting means is substantially equal to the wavelength of said illuminating light.

11. A projection optical apparatus comprising:
  (a) means for supporting a reticle provided with a plurality of patterns which are disposed periodically at a predetermined interval along a predetermined direction;
  (b) illuminating means for illuminating said reticle by predetermined light;
  (c) stage means;
  (d) a projection optical system for projecting an image of said reticle on a predetermined plane;
  (e) a pattern member disposed on said stage means so that said pattern member substantially corresponds with said predetermined plane, said pattern member having a light-transmitting area and a light-intercepting area, said light-transmitting area having a predetermined width along a direction corresponding to said predetermined direction; and
  (f) photoelectric detecting means for detecting the intensity of light passed through said light-transmitting area;
  (g) said predetermined interval being set so that the intensity distribution of the image of said plurality of patterns of said reticle lacks a predetermined Fourier component having a predetermined frequency, when the imaging magnification of said projection optical system is $\beta$ and said predetermined interval is $2a$ and a positive is m, said predetermined frequency being substantially defined as $2\beta a/(2m+1)$ and said predetermined width being substantially defined as $\beta a$.

12. A projection optical apparatus according to claim 11, wherein said pattern member has another light-transmitting area, wherein said first mentioned light-transmitting area and said second mentioned light-transmitting area are arranged at another predetermined interval along a direction corresponding to said predetermined direction, and wherein when a positive integral is l said second mentioned predetermined interval is substantially defined as $2l\beta a$.

13. A projection optical apparatus according to claim 11, wherein when the numerical aperture of said projection optical system is NA and the wavelength of said predetermined light is $\lambda$, said first mentioned predetermined interval satisfies the following condition:

$$a < \frac{3\lambda}{4NA}.$$

14. A projection optical apparatus according to claim 11, wherein when the numerical aperture of said projection optical system is NA, the wavelength of said predetermined light is $\lambda$ and the numerical aperture of said illuminating means with respect to said reticle is $\sigma NA$, said first mentioned predetermined interval satisfies the following condition:

$$a < \frac{\lambda}{(1+\sigma)NA}.$$

15. A projection optical apparatus according to claim 11, wherein said reticle has a plurality of light-transmitting areas and a plurality of light-intercepting areas, wherein said plurality of light-transmitting areas and said plurality of light-intercepting areas form said plurality of patterns, wherein the width of each of said plurality of light-transmitting areas and said plurality of light-intercepting areas is substantially a, wherein when the numerical aperture of said projection optical system is NA, the wavelength of said predetermined light is $\lambda$ and the numerical aperture of said illuminating means with respect to said reticle is $\sigma NA$, said first mentioned predetermined interval satisfies the following condition:

$$a < \frac{3\lambda}{2(1+\sigma)NA}.$$

16. A projection optical apparatus comprising:
  (a) means for supporting a reticle in a first plane, said reticle being provided with first pattern means;
  (b) stage means;
  (c) a pattern member disposed on said stage means in a second plane, said pattern member being provided with second pattern means;
  (d) illuminating means for illuminating one of said pattern means with radiation;
  (e) a projection optical system for projecting an image of one of said pattern means on the other of said pattern means; and
  (f) detecting means for detecting the intensity of radiation passed through said other pattern means;
  (g) one of said pattern means comprising a plurality of patterns disposed periodically at a predetermined interval along a predetermined direction, the other of said pattern means having a radiation-transmitting area and a radiation-intercepting area, said radiation-transmitting area having a predetermined width along a direction corresponding to said predetermined direction, said predetermined interval being set so that the intensity distribution of said image lacks a predetermined Fourier component having a predetermined frequency, when the imaging magnification of said projection optical is $\beta$ and said predetermined interval is $2a$ and a positive inserter is m, said predetermined frequency being substantially defined as $2\beta a/(2m+1)$ and said predetermined width being substantially defined as $\beta a$.

17. A projection optical apparatus according to claim 16, wherein said other pattern means has another radiation-transmitting area, wherein said first mentioned radiation-transmitting area and said second mentioned radiation-transmitting area are arranged at another predetermined interval along a direction corresponding to said predetermined direction, and wherein when a positive integer is 1 said second mentioned predetermined interval is substantially defined as $2l\beta a$.

18. A projection optical apparatus according to claim 16, wherein when the numerical aperture of said projection optical system is NA and the wavelength of said radiation is $\lambda$, said first mentioned predetermined interval satisfies the following condition:

$$a < \frac{3\lambda}{4NA}.$$

19. A projection optical apparatus according to claim 16, wherein when the numerical aperture of said projection optical system is NA, the wavelength of said radiation is $\lambda$ and the numerical aperture of said illuminating means with respect to said reticle is $\sigma NA$, said first mentioned predetermined interval satisfies the following condition:

$$a < \frac{\lambda}{(1 + \sigma)NA}.$$

20. A projection optical apparatus according to claim 16, wherein said plurality of patterns comprises a plurality of radiation-transmitting areas and a plurality of radiation-intercepting areas, wherein the width of each of said plurality of radiation-transmitting areas and said plurality of radiation-intercepting areas is substantially a, wherein when the numerical aperture of said projection optical system is NA, the wavelength of said radiation is $\lambda$ and the numerical aperture of said illuminating means with respect to the illuminated pattern means is $\sigma NA$, said first mentioned predetermined interval satisfies the following condition:

$$a < \frac{3\lambda}{2(1 + \sigma)NA}.$$

21. A projection optical apparatus according to claim 16, wherein said stage means has means for moving said stage means to cause scanning movement of said image relative to said detection means, and wherein said detecting means produces an output corresponding to said scanning movement.

* * * * *